(12) United States Patent
Pawloski et al.

(10) Patent No.: US 9,551,072 B2
(45) Date of Patent: Jan. 24, 2017

(54) GRAPHENE COATED SUBSTRATES AND RESULTING COMPOSITES

(71) Applicant: Stratasys, Inc., Eden Prairie, MN (US)

(72) Inventors: Adam R. Pawloski, Lake Elmo, MN (US); Gregory S. Bennett, Hudson, WI (US); Jeffrey Jacob Cernohous, Hudson, WI (US); Kent Kaske, Woodbury, MN (US); Adam E. Szymanski, St. Paul, MN (US)

(73) Assignee: Stratasys, Inc., Eden Prairie, MN (US)

( * ) Notice: Subject to any disclaimer, the term of this patent is extended or adjusted under 35 U.S.C. 154(b) by 0 days.

(21) Appl. No.: 14/405,059

(22) PCT Filed: Jun. 5, 2013

(86) PCT No.: PCT/US2013/044274
§ 371 (c)(1),
(2) Date: Dec. 2, 2014

(87) PCT Pub. No.: WO2013/184772
PCT Pub. Date: Dec. 12, 2013

(65) Prior Publication Data
US 2015/0148459 A1    May 28, 2015

Related U.S. Application Data

(60) Provisional application No. 61/655,712, filed on Jun. 5, 2012, provisional application No. 61/779,208, filed on Mar. 13, 2013.

(51) Int. Cl.
| | |
|---|---|
| C08K 9/00 | (2006.01) |
| C23C 18/12 | (2006.01) |
| H01L 21/02 | (2006.01) |
| C01B 31/04 | (2006.01) |
| B82Y 30/00 | (2011.01) |
| B82Y 40/00 | (2011.01) |
| C08K 3/04 | (2006.01) |
| C08K 5/3492 | (2006.01) |
| C08K 7/14 | (2006.01) |
| C09D 151/00 | (2006.01) |

(52) U.S. Cl.
CPC ............ *C23C 18/1204* (2013.01); *B82Y 30/00* (2013.01); *B82Y 40/00* (2013.01); *C01B 31/0484* (2013.01); *C08K 3/04* (2013.01); *C08K 5/34922* (2013.01); *C08K 7/14* (2013.01); *C09D 151/003* (2013.01); *C23C 18/1233* (2013.01); *C23C 18/1295* (2013.01); *H01L 21/02422* (2013.01); *H01L 21/02527* (2013.01); *H01L 21/02628* (2013.01); *C08K 2003/045* (2013.01)

(58) Field of Classification Search
CPC .... C08K 3/04; C23C 18/1204; C09D 151/003
See application file for complete search history.

(56) References Cited

U.S. PATENT DOCUMENTS

| | | | |
|---|---|---|---|
| 2010/0035186 A1 | 2/2010 | Hong et al. | |
| 2013/0156678 A1* | 6/2013 | Banerjee | B82Y 30/00 |
| | | | 423/445 R |

FOREIGN PATENT DOCUMENTS

| | | |
|---|---|---|
| JP | 2012031024 A | 2/2012 |
| KR | 1020100016928 A | 2/2010 |
| KR | 1020110016287 A | 2/2011 |
| KR | 1020110115389 A | 10/2011 |

OTHER PUBLICATIONS

Machine Translation of JP 2012-031024 (2012).*
Machine Translation of KR 10-2011-0016287 (2011).*
International Search Report dated Sep. 25, 2013 for corresponding International Patent Application No. PCT/US2013/044274, filed Jun. 5, 2013.
Gudarzi et al.: "Molecular Level Dispersion of Graphene in Polymer Matrices using Colloidal Polymer and Graphene", Journal of Colloid and Interface Science, 366 (2012), Oct. 8, 2011, pp. 44-50.
Chinese Office Action dated Jul. 4, 2016 for corresponding Chinese Application No. 201380029762.8, filed Dec. 5, 2014.
Kalaitzidou et al: "A new compounding method for exfoliated graphite-polypropylene nanocomposites with enhanced flexural properties and lower percolation threshold", Composites Science and Technology, Elsevier, UK, vol. 67, No. 10, May 9, 2007 (May 9, 2007), pp. 2045-2051.
Kuilla T et al.: "Recent advances in graphene based polymer composites", Progress in Polymer Science, Pergamon Press, Oxford, GB, vol. 35, No. 11, Jul. 27, 2010 (Jul. 27, 2010), pp. 1350-1375.
Extended Supplementary European Search report dated Jun. 1, 2016 for corresponding European Application No. 13799998.3, filed Dec. 26, 2014.

* cited by examiner

*Primary Examiner* — Hannah Pak
(74) *Attorney, Agent, or Firm* — Peter J. Ims; Westman, Champlin & Koehler, P.A.

(57) ABSTRACT

The deposition of graphene is accomplished by various techniques that result in a change of the graphene's solubility in the liquid medium. The solubility change enables the deposition of the graphene onto the substrate. Once the graphene is deposited onto the substrate, the at least partially coated substrate may be separated from the liquid medium. The substrates may then serve as a carrier to deliver the graphene to a desired application.

6 Claims, 3 Drawing Sheets

GRAPHENE COATED SUBSTRATES AND RESULTING COMPOSITES

CROSS REFERENCE TO RELATED APPLICATIONS

This application is a Section 371 National Stage Application of International Application No. PCT/US2013/044274, filed Jun. 5, 2013, published as WO 2013/184772 on Dec. 12, 2013, which is based on and claims the benefit of U.S. Provisional Patent Application No. 61/655,712 filed Jun. 5, 2012, and U.S. Provisional Patent Application No. 61/779,208 filed Mar. 13, 2013, the disclosures of each are herein incorporated by reference in their entirety.

TECHNICAL FIELD

Methods for coating substrates with graphene. The coated substrates may then be employed for various uses, such as, fillers in polymeric composites.

BACKGROUND

Graphene is a carbon allotrope that is theoretically embodied in a singular plane of carbon atoms. Graphene is commonly represented in the literature as a two dimensional honeycomb lattice with $sp^2$-bonded carbon atoms. In practice, those of ordinary skill in the art often refer to graphene as carbon material represented not only as a singular plane but also as multiple layers of singular carbon planes. Due to its unique structure, graphene possesses outstanding electrical mobility, or charge transport properties, but demonstrates little optical absorption. The noted features of graphene make it very desirable in certain applications, such as, semiconductor and photovoltaic articles.

Thermodynamically stable solutions of graphene have been created through conventional processes. In certain processes, common graphite is exfoliated and then dissolved into single-layer sheets of graphene. Graphene may be capable of imparting very desirable mechanical, thermal, chemical and electrical properties in its application. However, solution delivery of graphene becomes problematic due to the relatively large volume of solvent present with the graphene. The removal of the solution must be addressed in order to render the delivery of graphene viable using this format.

Electrically conductive materials may be employed as fillers in polymeric matrices. Conventional conductive fillers, such as carbon black, are added to polymer compositions at significantly larger loading levels of generally 15-25 percent by weight, leading to embrittlement and the loss of impact resistance. Carbon nanotubes are similarly effective at relatively lower loading levels than carbon black, specifically less than 5 percent by weight. However carbon nanotubes are expensive, offer poor structural reinforcement, and create industrial hygiene concerns through their handling and use. The conductive polymer field would benefit from advances that address conductivity without adversely affecting other properties of the polymer composite.

SUMMARY

Solutions containing soluble graphene can be processed to allow the transfer of the soluble graphene onto various substrates while the substrate is immersed in the liquid medium. The deposition of graphene is accomplished by various techniques that result in a change of the graphene's solubility in the liquid medium. The solubility change enables the deposition of the graphene onto the substrate. Once the graphene is deposited onto the substrate, the at least partially coated substrate may be separated from the liquid medium. The substrates may then serve as a carrier to deliver the graphene to a desired application. This approach eliminates handling excessive amounts of the solvent when attempting to apply solution based graphene directly in end use applications. The method is also suitable for timely applying graphene to a plurality of substrates in a single batch or continuous process.

In one embodiment, a substrate is immersed in a solution having a graphene solute. The graphene solute's solubility is changed such that the graphene coats at least a portion of the substrate. The change in solubility may be accomplished through various techniques. The techniques employed permit at least some form of deposition of the graphene onto the substrate. In certain embodiments and with specific substrates, the graphene adheres or bonds to the substrate without subsequent flaking or any unintentional release from the substrate. Additionally, the substrate may be treated to enhance the deposition of graphene from solution.

The graphene is deposited from solution onto the substrate as a single layer of graphene, or several layers of graphene, without forming aggregates of graphite. This enables a coated substrate with the desired physical and chemical properties of graphene.

The resulting substrate having at least a portion of its surface coated with graphene may provide certain properties in application. For example, mechanical reinforcement, thermal conductivity, chemical enhancement, and electrical conductivity may be imparted by including or using the coated substrates in certain devices, articles, chemistries or fields of use. In certain embodiments, the graphene coated substrates are applied in polymers. For example, the graphene coated substrate may be included in a polymeric matrix during melt processing.

For purposes of the disclosure, the following terms used in this application are defined as follows;

"Coat" or "Coating" means adhering, bonding (including chemical bonding), plating or attaching.

"Dispersed" means distributed throughout the polymeric matrix.

"Graphene" means a singular plane of $sp^2$ bonded carbon atoms and up to multiple layers of planes of $sp^2$ bonded carbon atoms, in certain embodiments there may be 1-20 planes, and in other embodiments 2-5 planes.

"Melt Processable Composition" means a formulation that is melt processed, typically at elevated temperatures, by means of a conventional polymer processing technique such as, for example, extrusion or injection molding;

"Melt Processing Techniques" means extrusion, injection molding, blow molding and rotomolding batch mixing;

"Polymeric Composite" means a mixture of a polymeric material and an additive or filler, including the graphene coated substrates of this disclosure.

"Polymeric Matrix" means a melt processable polymeric material or combination of materials.

The above summary is not intended to describe each disclosed embodiment or every implementation of the claimed subject matter. The detailed description that follows more particularly exemplifies illustrative embodiments.

DETAILED DESCRIPTION

Figure 1:
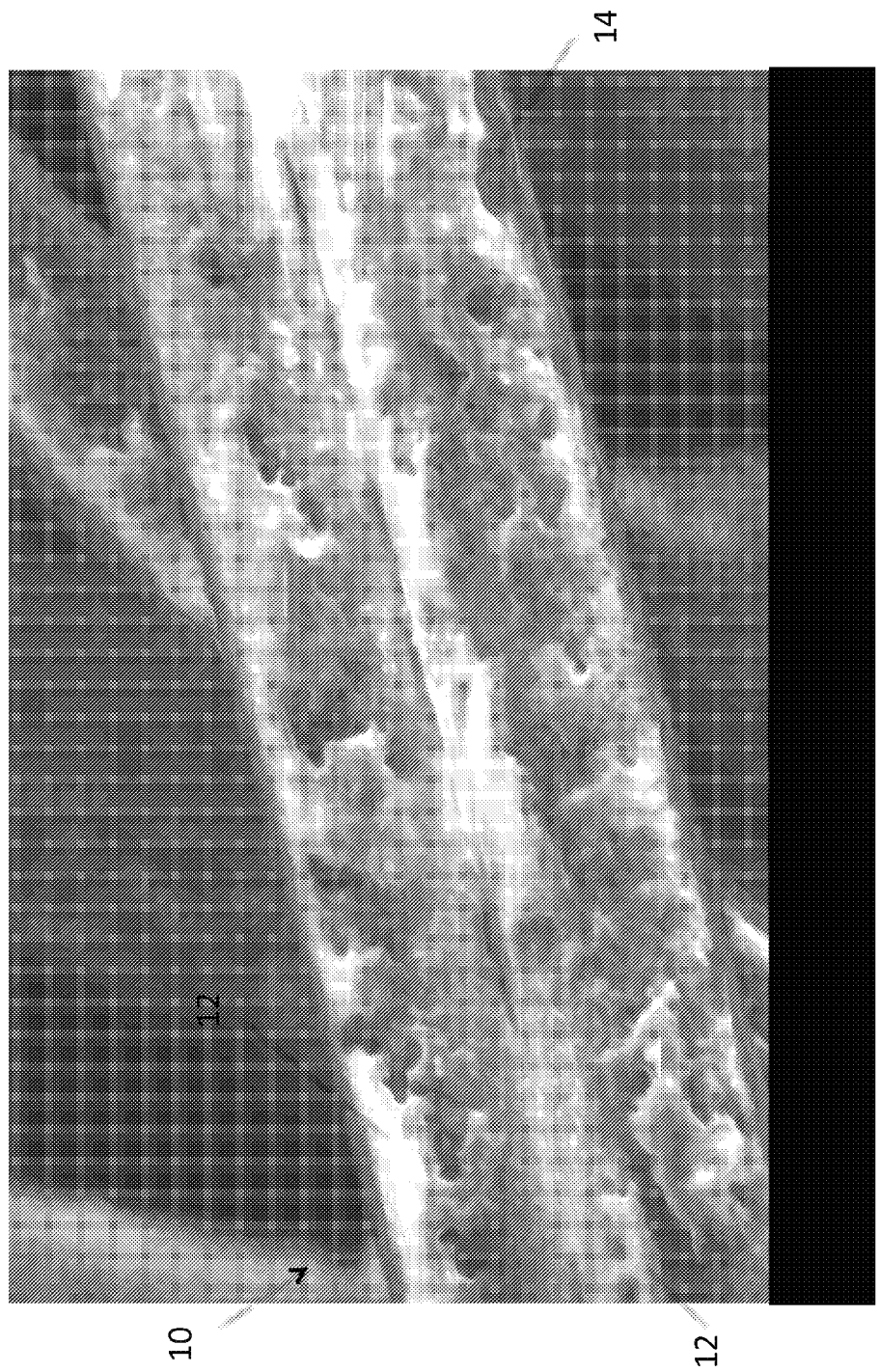
FIG. 1 is a scanning electron microscope figure of graphene coated onto glass fibers.

Solubilized graphene may be transferred onto a substrate in a liquid medium. The transfer is initiated and occurs by changing the solubility of graphene while the substrate is in the liquid medium. In one embodiment, a method for coating a substrate with graphene includes providing a solution having a graphene solute, immersing at least a portion of a substrate into the solution, and changing the graphene solute's solubility so that graphene coats at least a portion of the substrate. In certain embodiments, the coating of graphene may be a single layer or multiple layers of graphene but sufficient enough to enable electron mobility and possibly other physical and chemical properties.

The graphene is typically provided as a soluble material in solution. One example of a method utilized to create a soluble graphene in solution is disclosed in U.S. Pat. App. Publ. 2011/0117361 A1 ('361), herein incorporated by reference in its entirety. The '361 publication describes a relationship between the solvent quality and the intrinsic property of surface tension for various solvents. The relationship identifies an operating window that enables the creation of a thermodynamically stable solution with soluble graphene. If a thermodynamically stable solution of graphene is not obtained, then the mixture can be considered a dispersion. A dispersion is generally a mixture of particles with one state of matter within a continuous phase of dissimilar material in a separate phase of matter. However, for purposes of this disclosure, soluble graphene and insoluble graphene or graphite may be present in the solvent. For example, graphene may exceed the solubility limits of the solvent. The presence of soluble graphene will still enable coating of the graphene onto a substrate. Those of ordinary skill in the art are capable of determining a proper solvent to generate a thermodynamically stable solution containing graphene for a desired end use application. In certain embodiments, suitable solvents may include N-methylpyrrolidone, cyclohexyl pyrrolidinone, vinyl pyrrolidinone tertiary hindered amines or alcohols. The concentration of soluble graphene in the solvent may include 0.25 wt % up to 2 wt %, and in certain embodiments 0.4 wt % to 1 wt %. Those of ordinary skill in the art will recognize the trade-off that may occur at higher concentrations and potential for the formation of graphite instead of graphene.

Various substrates may be suitable for receiving or accepting graphene as the graphene transfers from a soluble phase in the solvent to a less soluble phase and onto the substrate. For example, graphene is capable of plating or coating onto various substrates. In certain embodiments, the substrate may be a thermoset polymer, thermoplastic polymer, filler, metal, organic material, inorganic material, glass, ceramic, biological material or a mixture thereof. The type of substrate selected, and its corresponding surface energy, may impact the amount of graphene and the type of coating the graphene and substrate will possess.

In certain embodiments, the substrate may be melt processable or at least capable of withstanding the melt processing environment. Additionally, the form of the substrate may lend to its applicability in a melt processable environment or is suitability for incorporation into a polymeric matrix. For example, the substrate may include particles, spheres or fibers suitable for accepting the graphene from solution as well as capable of withstanding the melt processing environment. Non-limiting examples of particles and fibers suitable for accepting graphene include mineral and organic fillers (e.g., talc, mica, volcanic ash, clay, silica, alumina, carbon fiber, carbon black, glass fiber) and conventional cellulosic materials (e.g., wood flour, wood fibers, sawdust, wood shavings, newsprint, paper, flax, hemp, wheat straw, rice hulls, kenaf, jute, sisal, peanut shells, soy hulls, or any cellulose containing material). Spheres may include, for example, glass microspheres, ceramic microspheres or cenospheres.

In an alternative embodiment, a melt processable material may be selected to function as both the substrate for accepting the graphene coating and then as the polymeric matrix during subsequent melt processing. The graphene coated, melt processable substrate remains solid during the coating process but melts at the elevated temperatures during melt processing to form at least a significant component of the polymeric matrix. Such dual purpose easily lends well to the delivery and dispersion of the graphene component.

The substrate may be treated to enhance or enable better adherence or bonding to the substrate. The treatment may occur prior to the introduction of the substrate to the solution containing soluble graphene. Alternatively, the treatment may occur during or after introduction of the substrate to the solution. Treatment techniques may include various surface modifications that are conventionally recognized by those of ordinary skill in the art. Non-limiting examples include silanation, plasma treating, coating by polymeric coupling agents, chemical vapor deposition, physical vapor deposition, surface conditioning with acids or bases, surface cleaning, thermal processing, surfactant treatment, oxidation, reduction, peroxide treatment, or combinations thereof.

In another embodiment, surface modification of the graphene, the substrate or both may occur during the graphene coating process. Surface modification may take various forms recognized by those of ordinary skill in the art. For example, certain compounds or materials may be utilized to increase the efficiency of the coating process. Limiting the stacking of grapheme layers or capping the graphene is one desirable effect. Non-limiting examples of materials suitable to prevent stacking of graphene include amines, aminoazines, azines, titanates, and silanes. Such materials may be added to a solution containing graphene where they are soluble and able to crash out of solution. Those of ordinary skill in the art are capable of selecting an appropriate compound and concentration based upon the desired substrate and concentration of graphene in the liquid medium.

The coating of the substrate may begin once the selection and preparation of a specific substrate has been finalized. Suitable methods for transferring graphene generally involve immersing the substrate in a solution having a graphene solute. The solubility of the graphene solute is then changed in order to initiate the coating process. As the solubility changes, the graphene will move from a soluble phase in solution to a solid phase that will attach to the substrate present in the liquid medium.

There are a multitude of mechanisms suitable for changing the solubility of the graphene solute. The objective is to change the equilibrium or overall solubility of the graphene in the liquid medium such that the graphene changes phases. The phase change results in the graphene coating onto another object present in the liquid medium. Non-limiting examples of mechanisms for transferring the graphene onto a substrate or substrates include adding an antisolvent to reduce the solubility of graphene, cooling of the solution, heating the solution, bubbling a vapor through the solution, adding a salt, changing the solution's pH value, introducing shear, distilling the solution, flowing the solution through a packed column, evaporating solvent, changing a surface energy of the substrate, introducing a substrate, or combinations thereof. Those of ordinary skill in the art with knowledge of this disclosure are capable of matching a desired substrate with a select process to enable an optimal coating of graphene onto an article.

In certain embodiments, the graphene is sufficiently deposited onto the substrate without employing multiple passes or separate and distinct attempts to coat the substrate. The immersion time of the substrate in the liquid medium may be dependent upon certain factors, including, for example, the method used, the percent graphene solute in solution, rates of addition, or manipulation of the systems thermodynamics. Once the solubility change occurs, the graphene will then coat or bond to another object.

In some embodiments, the purity of graphene and possibility of graphite formation will be dependent on the overall percent weight of graphene after coating, surface area of substrate, the method employed, and specific rates of the method used. Those of ordinary skill in the art will recognize that the greater amount of surface area exposed may correspond to a higher quality of graphene coating and potentially thinner sheets of graphene without the formation of graphite. Additionally, faster rates will potentially yield thicker coatings and thereby increase the likelihood of graphite formation on the surface of the substrate. The required coating rate may also be a function of the graphene concentration in the solution. The graphene yield will vary depending on the broad circumstances and conditions selected for a given application. In some embodiments, up to 75% of the graphene in solution may deposit on the substrate.

Upon completion of the coating process, it is often desirable to separate the coated article or articles from the liquid medium. Conventional liquid-solid separate practices may be employed to remove the remaining liquid. Non-limiting examples include filtration, centrifugation, drying, and decanting. In certain embodiments, there may be further post treatment of the coated substrate to ensure the graphene is stable and sufficiently adhered. The substrate is then collected for end use applications.

The presence of graphene on the substrate may be easily detected through conventional SEM imaging. Other properties and characteristics of the coated substrate, such as conductivity, may be tested as well. Those of ordinary skill in the art are capable of performing standard characterization techniques for composite materials.

Figure 2:
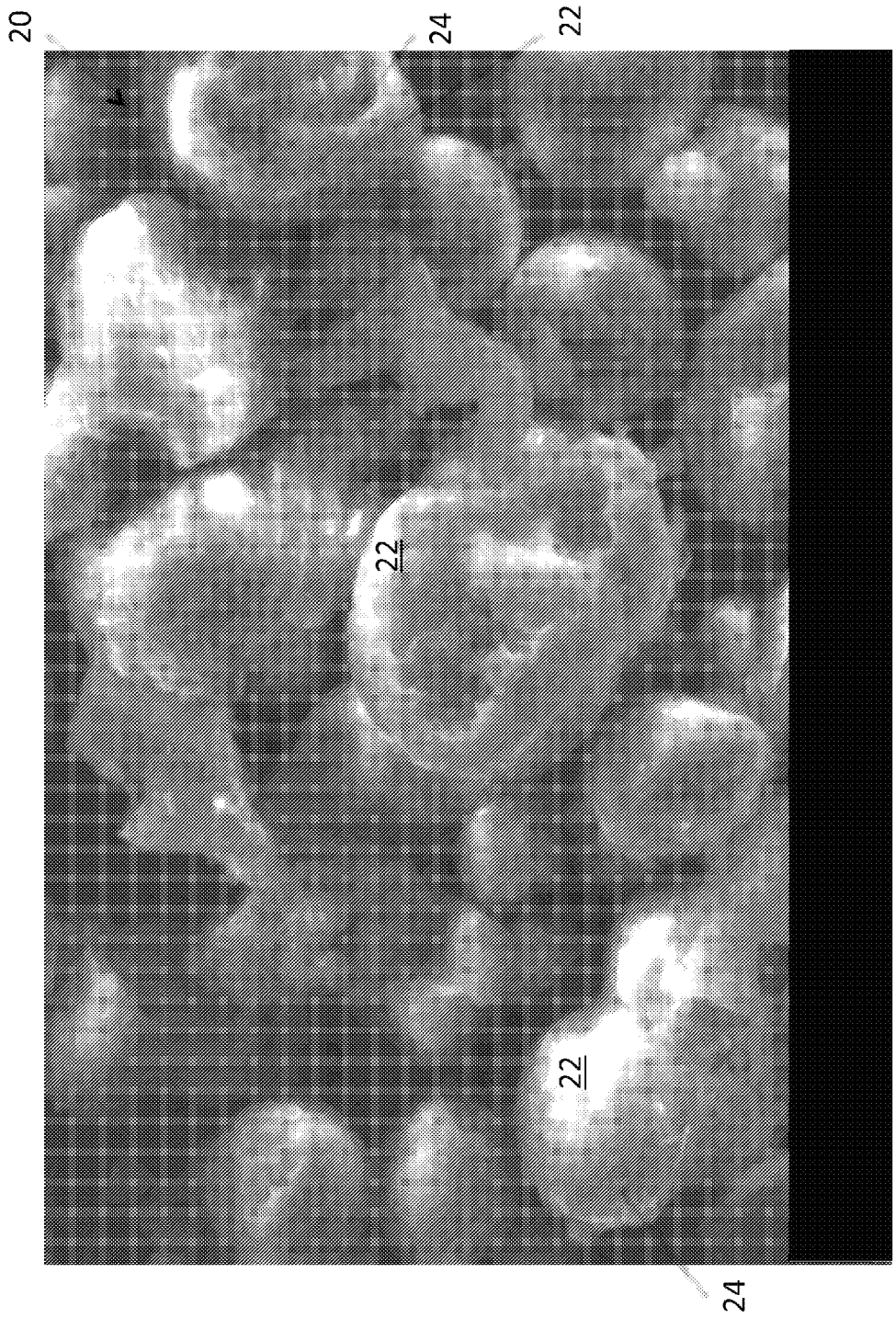
FIG. 2 is a scanning electron microscope figure of graphene coated onto particles of volcanic ash.
Figure 3:
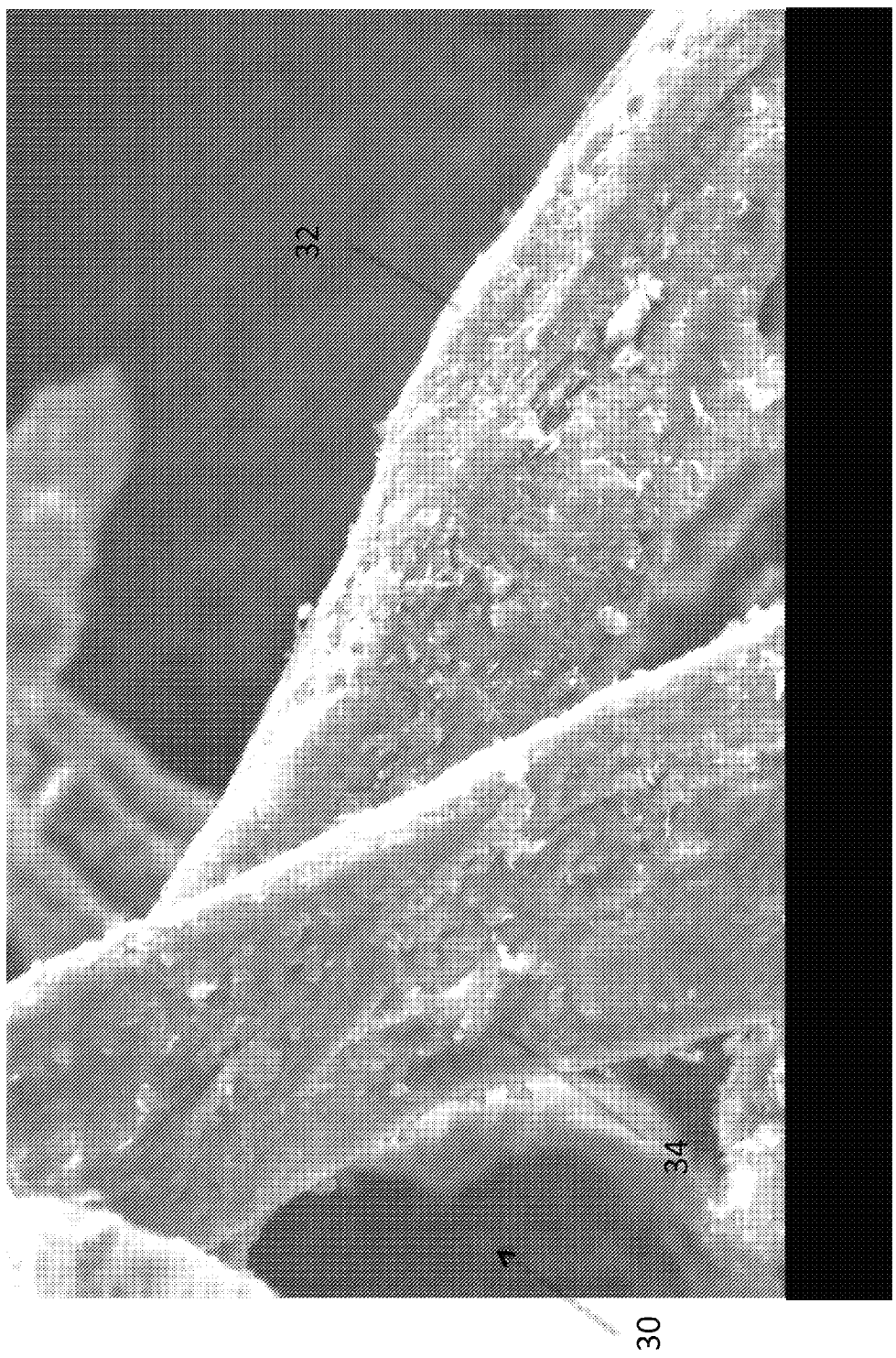
FIG. 3 is a scanning electron microscope figure of graphene coated onto cellulose.

The graphene coated substrates possess some unique properties or characteristics. FIG. 1 is an SEM image at 3500× of a coated article 10 depicting graphene 12 coated onto glass fibers 14 resulting from a 20 mL solution with 1 gram of fibers using a water addition method. FIG. 2 is an SEM image at 4000× of a plurality of coated particles 20 created by using 1 gram of substrate in a 15 mL solution with a water addition method to enable a coating of graphene 22 deposited onto a volcanic ash particles 24. FIG. 3 is another SEM image at 2500× showing graphene coated material 30 created by depositing graphene 32 onto cellulose 34. The graphene 32 was coating onto the cellulose 34 by using 1 gram of cellulose in a 20 mL solution and applying heat for three days.

The graphene coated substrates may serve as functional fillers in polymeric composites. The coated substrates are capable of imparting certain characteristics to the polymeric composite. Non-limiting examples of properties imparted to devices, articles, chemistries or fields of use include, mechanical reinforcement, thermal conductivity, chemical enhancement, and electrical conductivity. In certain embodiments, the graphene coated substrate may be included in a polymeric matrix during melt processing. High loading levels of up to 90 wt % of graphene coated substrates may be desirable for certain applications, such as master batch formulations for the subsequent let down into finished composites. In specific embodiments, the fillers may be included in polymeric composites in amounts ranging from about 0.5 wt % to about 30 wt %.

Polymers suitable as the polymeric matrix include high density polyethylene (HDPE), low density polyethylene (LDPE), linear low density polyethylene (LLDPE), polypropylene (PP), polyolefin copolymers (e.g., ethylene-butene, ethylene-octene, ethylene vinyl alcohol), polystyrene, polystyrene copolymers (e.g., high impact polystyrene, acrylonitrile butadiene styrene copolymer), polyacrylates, polymethacrylates, polyesters, polyvinylchloride (PVC), fluoropolymers, polyamides, polyether imides, polyphenylene sulfides, polysulfones, polyacetals, polycarbonates, polyphenylene oxides, polyurethanes, thermoplastic elastomers (e.g., SIS, SEBS, SBS), epoxies, alkyds, melamines, phenolics, ureas, vinyl esters, liquid crystal polymers or combinations thereof. Polyolefins and thermoplastic elastomers are well suited for certain applications.

In an alternative embodiment, the substrate or substrates may be selected such that their melt temperature is below the processing temperature of the polymeric matrix during melt processing. In this situation, the substrate is utilized to deliver the graphene to the melt processing operation, but then release the graphene during melt processing. This may enhance the dispersion of the graphene in the polymeric matrix. The substrate upon melting may be miscible with the polymeric matrix or provide some other functional aspect to the polymeric composite after processing.

In yet another alternative embodiment, the substrate or substrates may be selected such that they transition to a vapor component at the processing temperature of the polymeric matrix during melt processing. In this situation, the substrate is also utilized to deliver the graphene to the melt processing operation, but then release the graphene during melt processing. This again may enhance the dispersion of the graphene in the polymeric matrix. The substrate upon transitioning to a vapor component may then be removed from the polymeric matrix by suction or other vapor removal mechanisms without remaining in the polymeric composite and adversely affecting the material after processing. Alternatively, the vapor may remain in the melt and function as a blowing agent in the polymeric matrix.

In an optional embodiment, a solvent may be employed during melt processing or prior to processing to enable the release or dissolution of the graphene from the substrate. This approach may lend to enhancing the dispersion of the graphene and thereby improve certain properties of the polymeric matrix. Additionally the solvent may serve a specific function during melt processing or even in the polymeric matrix. A non-limiting example would be the use of super critical $CO_2$ which would then be added back into the polymer matrix and subsequently vented. Those of ordinary skill in the art are capable of selecting a solvent in combination with a desired substrate to affect the release of the graphene.

In another embodiment, the polymeric composite can be melt processed with additional conventional fillers and additives. Typically, when a polymer matrix is melt processed with increasing loading levels of a filler, the flexural modulus of the resulting composite typically increases, but the impact strength decreases. By adding the reinforcing additives to a filled polymeric matrix, the flexural modulus and impact strength both increase. Non-limiting examples of fillers include mineral and organic fillers (e.g., talc, mica, clay, silica, alumina, carbon fiber, carbon black glass fiber) and conventional cellulosic materials (e.g., wood flour, wood fibers, sawdust, wood shavings, newsprint, paper, flax, hemp, wheat straw, rice hulls, kenaf, jute, sisal, peanut shells, soy hulls, or any cellulose containing material). The amount of filler in the melt processable composition may vary depending upon the polymeric matrix and the desired physical properties of the finished composition. Those skilled in the art of melt processing polymers are capable of selecting appropriate amounts and types of fillers to match a specific polymeric matrix.

In another aspect, the melt processable composition may contain other additives. Non-limiting examples of conventional additives include: antioxidants, light stabilizers, fibers, blowing agents, foaming additives, antiblocking agents, heat stabilizers, impact modifiers, biocides, compatibilizers, tackifiers, colorants, coupling agents, and pigments. The additives may be incorporated into the melt processable composition in the form of powders, pellets, granules, or in any other extrudable form. The amount and type of conventional additives in the melt processable composition may vary depending upon the polymeric matrix and the desired physical properties of the finished composition. Those skilled in the art of melt processing are capable of selecting appropriate amounts and types of additives to match with a specific polymeric matrix in order to achieve desired physical properties of the finished material.

The melt processable composition can be prepared by any of a variety of ways. For example, the thermoplastic matrix, graphene coated substrates, and any other optional additives or fillers can be combined together by any of the blending means usually employed in the plastics industry, such as with a compounding mill, a Banbury mixer, or a mixing. The polymeric matrix, conventional fillers and additives may be used in the form, for example, of a powder, a pellet, or a granular product. The mixing operation, optionally with the graphene coated substrate or substrates, is most conveniently carried out at a temperature above the melting point or softening point of the polymeric matrix. The resulting melt-blended mixture can be either extruded directly into the form of the final product shape or pelletized or otherwise comminuted into a desired particulate size or size distribution and fed to an extruder, which typically will be a single-screw extruder, that melt-processes the blended mixture to form the final product shape. The extruded product may be in the form of pellets, film, sheet or a selected profile.

Melt-processing typically is performed at a temperature from 120° to 300° C., although optimum operating temperatures are selected depending upon the melting point, melt viscosity, and thermal stability of the composition. Different types of melt processing equipment, such as extruders, may be used to process the melt processable compositions of this disclosure.

The amount of graphene coated material in the melt processable composition may vary depending upon the polymeric matrix and the desired properties of the finished composition. Those skilled in the art of melt processing polymers with knowledge of this disclosure are capable of selecting appropriate amounts and types of graphene coated substrates to match with a specific polymeric matrix in order to achieve desired physical, thermal, electrical, or chemical characteristics or properties in the finished material.

In the field of polymeric composites, it is often necessary to balance certain features of the composite to achieve overall performance for intended applications. With graphene coated substrates, various features may be addressed or tailored to meet specifications for a given application. Non-limiting examples of variables that potentially impact end use applications include, the degree or amount of graphene coated on the substrate, the bond strength of the graphene to the selected substrate, the specific substrate and its melt processing characteristics, and the mechanical strength of a selected substrate. Those of ordinary skill in the art with knowledge of this disclosure are capable of preferentially addressing the various attributes of the graphene and the substrate to achieve a balance of desired properties.

The resulting articles produced by melt processing the inventive composition exhibit superior mechanical and electrical characteristics. For example, a composite comprised of a graphene coated glass fiber in a polypropylene matrix exhibits substantial increases in electrical conductivity along with enhanced flexural modulus, flexural strength and impact strength.

The composites of this invention are suitable for manufacturing articles in many industries including the electronics, battery, photovoltaic, semiconductor, construction and automotive industries.

Exemplary embodiments include the following:

Embodiment 1

A method comprising transferring solubilized graphene onto a substrate in a liquid medium, wherein transferring occurs by changing the solubility of graphene in the liquid medium.

Embodiment 2

A method according to embodiment 1, wherein transferring occurs by adding an antisolvent, cooling of the solution, heating the solution, bubbling a vapor through the solution, adding a salt, changing the solution's pH value, introducing shear, distilling the solution, flowing the solution through a packed column, evaporating solvent, changing a surface energy of the substrate, introducing a substrate, or combinations thereof.

Embodiment 3

The method according to either of embodiments 1 or 2, wherein the substrate is a thermoset polymer, thermoplastic polymer, filler, metal, organic material, inorganic material, glass, ceramic, biological material or a mixture thereof.

Embodiment 4

A method according to any of embodiments 1 to 3, further comprising separating the substrate from the solution.

Embodiment 5

A method according to any of embodiments 1 to 4, wherein the solution containing graphene includes N-methylpyrrolidone, cyclohexyl pyrrolidinone, vinyl pyrrolidinone or tertiary hindered amines.

Embodiment 6

A method according to any of embodiments 1 to 5, further comprising pretreating the substrate to enable bonding of the graphene to the substrate.

Embodiment 7

A method comprising,
(a) providing a solution having a graphene solute,
(b) immersing at least a portion of a substrate into the solution, and
(c) changing the graphene solute's solubility so that graphene coats the substrate immersed in solution.

Embodiment 8

An article comprising a substrate having a surface, wherein graphene is attached to at least a portion of the surface of the substrate by the process of embodiment 1.

Embodiment 9

An article according to embodiment 8, further comprising a polymeric matrix wherein the substrate is distributed in the polymeric matrix.

Embodiment 10

An article according to either of embodiments 8 or 9, wherein the substrate is a thermoset polymer, thermoplastic polymer, filler, metal, organic material, inorganic material, glass, ceramic, biological material or a mixture thereof.

Embodiment 11

A composition comprising;
(a) a polymeric matrix, and
(b) a substrate with at least a portion of a surface of the substrate coated with graphene, the substrate dispersed throughout the polymeric matrix.

Embodiment 12

A composition according to embodiment 11, wherein the polymeric matrix includes high density polyethylene, low density polyethylene, linear low density polyethylene, polypropylene, polyolefin copolymers, polystyrene, polystyrene copolymers, polyacrylates, polymethacrylates, polyesters, polyvinylchloride, fluoropolymers, polyamides, polyether imides, polyphenylene sulfides, polysulfones, polyacetals, polycarbonates, polyphenylene oxides, polyurethanes, thermoplastic elastomers, epoxies, alkyds, melamines, phenolics, ureas, vinyl esters, liquid crystal polymers or combinations thereof.

Embodiment 13

A composition according to either of embodiments 11 or 12, wherein the substrate is a plurality of particles, spheres, fibers, or combinations thereof.

Embodiment 14

A composition according to any of embodiments 11 to 13, wherein the substrate serves as both components (a) and (b).

Embodiment 15

A method comprising melt processing a polymeric matrix with a substrate having at least a portion of a surface of the substrate coated with graphene.

Embodiment 16

A method according to embodiment 15, wherein the substrate melts or forms a vapor component during melt processing.

Embodiment 17

A method according to either of embodiments 15 or 16, wherein the substrate releases the graphene into the polymeric matrix during melt processing.

Embodiment 18

A method according to any of embodiments 15 to 17, wherein the substrate is a plurality of particles, spheres, fibers, or combinations thereof and the particles, fibers or combinations thereof are distributed into the polymeric matrix.

Embodiment 19

A method comprising melt processing a melt processable polymeric matrix and a substrate, the substrate having at least a portion of a surface of the substrate coated with graphene.

Embodiment 20

A composition comprising a polymeric matrix having graphene dispersed in the polymeric matrix, wherein the graphene is dispersed by melt processing the polymeric matrix with a substrate having at least a portion of a surface of the substrate coated with graphene and wherein the substrate melts or forms a vapor component during melt processing and releases the graphene into the polymeric matrix.

Embodiment 21

A composition according to embodiment 21, wherein the substrate is miscible in the polymeric matrix.

Embodiment 22

A method comprising melt processing a polymeric matrix with a substrate having at least a portion of a surface of the substrate coated with graphene wherein the graphene is released from the substrate with a solvent during or before melt processing.

Embodiment 23

A method according to any of embodiment 1, 7 or 15, wherein the solubilized graphene, the substrate or both are subject to surface modification in the liquid medium.

Embodiment 24

A method according to embodiment 23, wherein surface modification is accomplished by introducing amines, aminoazines, titanates, silanes, or combinations thereof into the liquid medium.

Embodiment 25

The composition of any of embodiments 11 to 14 or 20 to 21, further comprising a surface modifier compound coated onto the substrate or graphene.

Example 1

Substrates used to generate the following examples include:

TABLE 1

| Material | Description |
| --- | --- |
| Volcanic ash | Dry volcanic ore, commercially available from Kansas Minerals, Inc. (Mankato, KS) |
| Glass fiber | EC14 738 4 mm available from Johns Manville (Denver, CO) |
| Cellulose | TC Cellulose; Grade: CF 442 Diced |
| MAPP | XP676, maleic anhydride grafted polypropylene, from Interfacial Solutions LLC (River Falls, WI) |
| MAPE | XP433, maleic anhydride grafted polyethylene, from Interfacial Solutions LLC (River Falls, WI) |
| Maleated Engage | XP722 a maleic anyhydride grafeted ethylene copolymer containing EEA (ethylene-ethy acrylate), EVA (ethylene-vinyl acetate), and EBAC (ethyl-butyl acrylate), from Interfacial Solutions LLC (River Falls, WI) |

Water Method for Obtaining Graphene Coated Articles.

Approximately 1 gram of a selected substrate from Table 1, a magnetic stir bar, and 20 ml of a 1% graphene in N-methylpyrrolidone (NMP) solution were placed in a 250 ml Pyrex beaker. The beaker containing the solution was placed on a hot plate/stirrer to induce magnetic stirring. 400 rpm stir setting. About 20 ml of water was added to the solution dropwise using a Nalgene 50 ml burret. The rate of drops was adjusted to give 2 drops per minute. NMP is miscible in water while graphene is not. The graphene is less soluble in the new NMP/water solution. As the water concentration was slowly increased, the solubility of the NMP in the solution slowly decreased. Water was added until the saturation point was reached and the graphene slowly crashed out, preferentially coating the substrate surface.

Heating Method for Obtaining Graphene Coated Articles.

A VWR hot plate/stirrer was heated to 150° C. Approximately 1 gram of substrate selected from table 1, a magnetic stir bar, and 20 ml of a 1% graphene in NMP solution was placed in a 250 ml Pyrex beaker. The beaker containing the solution was placed on a hot plate/stirrer to induce magnetic stirring with a 400 rpm setting as the stirring rate. The solution was left to sit while stirring under heat and atmosphere for three days. The slow evaporation of solvent caused the NMP to reach its saturation point and graphene was slowly crashed out preferentially coating onto the substrate surface. Conductivity was tested by resistance using a Multipro 530A True multimeter. Certain volcanic ash, cellulose, glass fiber, Maleated polypropylene, and Maleated engage substrates exhibited conductivity.

Water with the Addition of Melamine Method for Obtaining Graphene Coated Articles.

Approximately 0.49 grams of a selected substrate from table 1, a magnetic stir bar, and 10 ml of a 1% graphene in N-methylpyrrolidone (NMP) solution were placed in a 250 ml Pyrex beaker. The beaker containing the solution was placed on a hot plate/stirrer to induce stirring at 400 rpm. About 1 gram of melamine was dissolved in 50 ml of water by heating the water to near boiling the melamine solution is kept near boiling while about 20 ml of the solution was added to the graphene solution dropwise using a Nalgene 50 ml burret. Two drops of melamine solution was added until the saturation point was reached and the graphene slowly crashed out, preferentially coating the substrate surface. As the graphene slowly crashed out of solution, the melamine contained in the hot solution crashed out as well, due to the decreased solubility of melamine in the now cool solution. As the graphene attaches to the substrate surface the melamine coats out onto the graphene surface, thus capping the attached graphene surface off the further graphene deposits.

From the above disclosure of the general principles and the preceding detailed description, those skilled in the art will readily comprehend the various modifications and embodiments to which the present invention is susceptible. Therefore, the scope of the invention should be limited only by the following claims and equivalents thereof.

What is claimed is:

1. A method of coating graphene onto a substrate, the method comprising transferring solubilized graphene onto the substrate in a liquid medium by changing the solubility of graphene in the liquid medium wherein changing the solubility of the graphene in the liquid medium occurs by adding an antisolvent, cooling of the liquid medium, bubbling a vapor through the liquid medium, adding a salt to the liquid medium, changing the liquid medium's pH value, introducing shear into the liquid medium, distilling the liquid medium, flowing the liquid medium through a packed column, evaporating solvent, changing a surface energy of the substrate, or combinations thereof.

2. The method according to claim 1, further comprising separating the substrate coated with the graphene from the liquid medium.

3. A method of forming a polymeric composite, the method comprising melt processing a polymeric matrix with a substrate having at least a portion of a surface of the substrate coated with graphene released from the substrate with a solvent during or before melt processing to form the polymeric composite wherein the graphene, the substrate or both are subject to surface modification in a liquid medium wherein the surface modification is accomplished by introducing amines, aminoazines, titanates, silanes, or combinations thereof into the liquid medium.

4. The method according to claim 3, wherein the substrate comprises a plurality of particles, spheres, fibers, or combinations thereof.

5. The method according to claim 3, wherein the substrate melts or forms a vapor component during melt processing.

6. The method according to claim 3, wherein the substrate releases the graphene into the polymeric matrix during melt processing.

* * * * *